United States Patent
Hanaoka et al.

(10) Patent No.: US 8,440,253 B2
(45) Date of Patent: May 14, 2013

(54) DROPLET DISCHARGE AMOUNT MEASURING METHOD AND ORGANIC ELECTROLUMINESCENCE APPARATUS MANUFACTURING METHOD

(75) Inventors: Hidetaka Hanaoka, Hara-Mura (JP); Atsushi Kitabayashi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 518 days.

(21) Appl. No.: 12/729,495

(22) Filed: Mar. 23, 2010

(65) Prior Publication Data

US 2010/0255746 A1    Oct. 7, 2010

(30) Foreign Application Priority Data

Apr. 1, 2009  (JP) ................................. 2009-088677

(51) Int. Cl.
   *B05D 5/06* (2006.01)
(52) U.S. Cl.
   USPC .......................................................... 427/64
(58) Field of Classification Search ............... 427/64
   See application file for complete search history.

(56) References Cited

U.S. PATENT DOCUMENTS

| 8,011,749 B2 * | 9/2011 | Kim et al. ........................ 347/14 |
| 2004/0145858 A1 * | 7/2004 | Sakurada ........................ 361/600 |
| 2005/0122363 A1 * | 6/2005 | Koyama ........................ 347/19 |
| 2008/0180686 A1 | 7/2008 | Sakai et al. |

FOREIGN PATENT DOCUMENTS

| JP | A-2005-121401 | 5/2005 |
| JP | A-2008-185372 | 8/2008 |

* cited by examiner

*Primary Examiner* — Michael Cleveland
*Assistant Examiner* — Robert Vetere
(74) *Attorney, Agent, or Firm* — Oliff & Berridge, PLC

(57) ABSTRACT

A droplet discharge amount measuring method for measuring the amount of droplets of a functional solution discharged from a droplet discharge apparatus, the functional solution containing a solid component and a solvent, includes discharging droplets of the functional solution from the droplet discharge apparatus onto a test surface, drying for allowing the solvent on the test surface to evaporate from the droplets so that solid dots be left and measuring the volume of the solid dots using an imaging technique, wherein in drying, the droplets are condensed as the solvent evaporates therefrom, and thus the resulting solid dots have smaller areas than the parent droplets upon landing on the test surface.

8 Claims, 5 Drawing Sheets

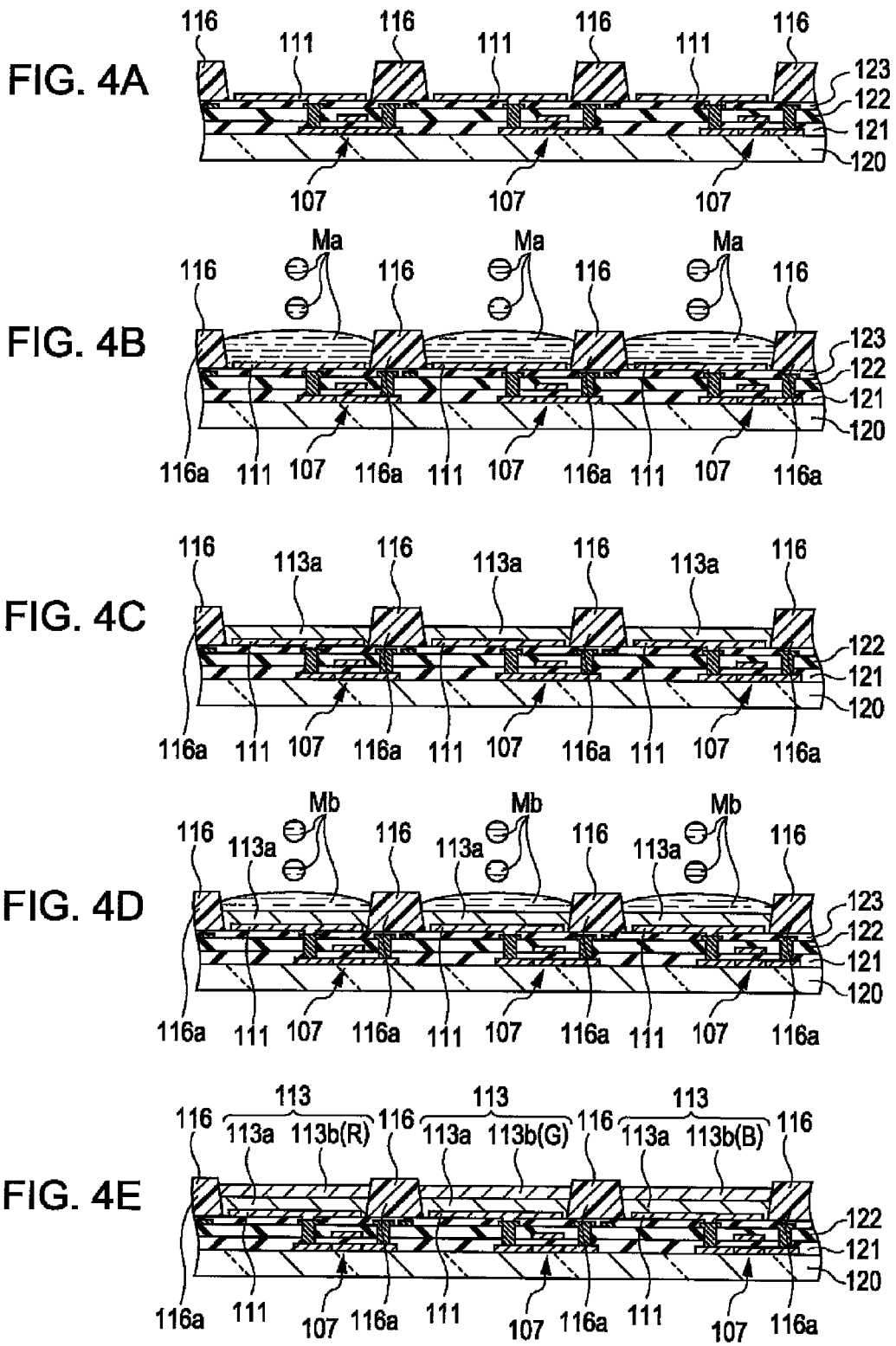

DROPLET DISCHARGE AMOUNT MEASURING METHOD AND ORGANIC ELECTROLUMINESCENCE APPARATUS MANUFACTURING METHOD

BACKGROUND

1. Technical Field

The present invention relates to a droplet discharge amount measuring method for measuring the amount of droplets of a functional solution discharged from a droplet discharge apparatus and an organic electroluminescence (EL) manufacturing method based on this droplet discharge amount measuring method.

2. Related Art

Organic EL apparatuses can be manufactured by several existing methods, for example, a method in which a functional solution is discharged from a droplet discharge apparatus, and then the functional solution is dried to form a luminescent layer retaining organic EL devices. However, the amount of functional solution discharged from the droplet discharge apparatus varies depending on the characteristics of pressure-generating devices used and the status of nozzle openings. To overcome this inconvenience, JP-A-2005-121401 has proposed a method in which droplets of a functional solution are discharged from a droplet discharge apparatus onto a test surface, the volume of the droplets that land on the test surface is measured, and then the volume measurement is used to adjust the droplet discharge amount.

However, as shown in FIG. 5, droplets M that land on a test surface 11 gradually loses their volume as the solvent thereof evaporates. In the method described in JP-A-2005-121401, there is a time lag between the landing of the droplets and measurement, and thus the accurate volume of the droplets on landing cannot be measured.

SUMMARY

An aspect of the invention is a method in which after droplets M land on a test surface 11, the solvent thereof is allowed to evaporate, leaving solid dots D, and then the volume of the solid dots D is measured using an imaging technique. This method is, however, still imperfect; when the concentration of solid matter in the functional solution used is as low as less than 10 wt %, the method cannot accurately measure the volume of solid dots D because of the too small thickness of the solid dots D.

An advantage of some aspects of the invention is to provide a droplet discharge amount measuring method for accurately measuring the amount of droplets discharged from a droplet discharge apparatus regardless of the rate of solvent evaporation or the concentration of solid matter. Another advantage of some aspects of the invention is to provide an organic EL apparatus manufacturing method based on this droplet discharge amount measuring method.

More specifically, an aspect of the invention is a droplet discharge amount measuring method for measuring the amount of droplets of a functional solution discharged from a droplet discharge apparatus, the functional solution containing a solid component and a solvent. This method includes discharging droplets of the functional solution from the droplet discharge apparatus onto a test surface, drying for allowing the solvent on the test surface to evaporate from the droplets so that solid dots can be left, and measuring the volume of the solid dots using an imaging technique. In the drying process, the droplets are condensed as the solvent evaporates therefrom, and thus the resulting solid dots have smaller areas than the parent droplets upon landing on the test surface.

The measurement target is not the volume of droplets upon landing on a test surface, but that of solid dots left after solvent evaporates from the droplets. The measured volume of solid dots is used to quantify the droplets, and this will minimize measurement errors due to changes in droplet volume associated with solvent evaporation. Also, as described above, the droplets are condensed as the solvent evaporates therefrom, and thus the resulting solid dots have smaller areas than the parent droplets upon landing on the test surface. As a result, the solid dots have a sufficient thickness for imaging-based accurate measurement of solid dot volume, and the amount of the droplets can be measured accurately.

In the above-described solid dot volume measuring process, measurement is preferably based on optical interference. This would allow for not only accurate but also non-contact measurement of solid dot volume.

This aspect of the invention preferably includes a repellant treatment between the discharging process and the drying process. The repellant treatment is to make the test surface repellent against the functional solution and would facilitate the condensation of droplets during the drying process, making sure that the resulting solid dots have smaller areas than the parent droplets upon landing on the test surface. As a result, the solid dots have a further increased thickness, and thus the amount of the droplets can be measured more accurately.

This repellant treatment preferably involves the coating of the test surface with fluorine and plasma. When treatments with fluorine and plasma are employed, it is preferable that the test surface be made of resin. This configuration would further facilitate the condensation of droplets during the drying process, making sure that the resulting solid dots have smaller areas than the parent droplets upon landing on the test surface. As a result, the solid dots have an even more increased thickness, and thus the amount of the droplets can be measured even more accurately.

The droplet discharge amount measuring method according to the above-described aspect of the invention can be used to manufacture organic EL apparatuses. More specifically, measurements obtained using this droplet discharge amount measuring method can be used to adjust the amount of droplets of the functional solution discharged from the droplet discharge apparatus, and the adjusted amount of droplets can be used during the formation of an organic functional layer retaining organic EL devices. Organic EL apparatuses manufactured in this way can be used as full-color displays for cellular telephones, TVs, on-board panels for automobiles, personal computers, PDAs, and other electronics and also as exposure heads for printers, photocopiers, and other image-forming machines.

BRIEF DESCRIPTION OF THE DRAWINGS

The invention will be described with reference to the accompanying drawings, wherein like numbers reference like elements.

FIGS. 4A to 4E are cross-sectional diagrams illustrating processes included in a manufacturing method of an organic EL apparatus according to an aspect of the invention.

DESCRIPTION OF EXEMPLARY EMBODIMENTS

Figure 1A:
FIGS. 1A to 1E illustrate a droplet discharge amount measuring method according to an aspect of the invention.

The following describes some embodiments of the invention with reference to drawings. Note that in the drawings, the scale may be different among layers and members for viewability.

Droplet Discharge Amount Measuring Method

Figure 1B:
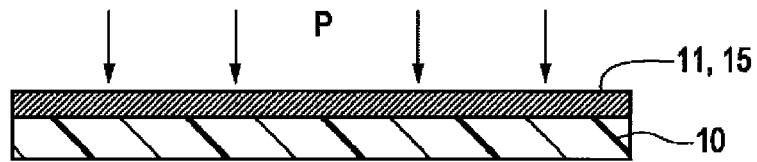
Figure 1C:
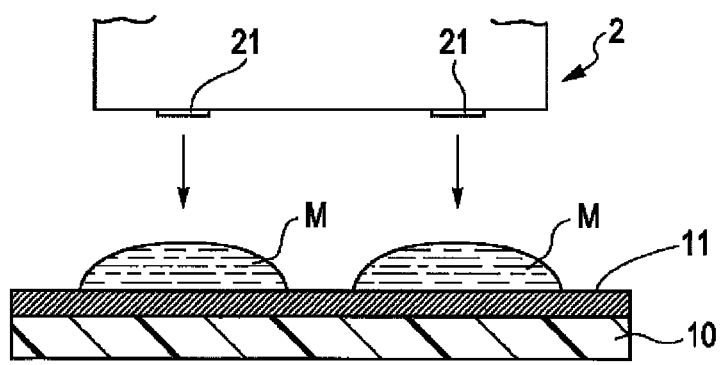

Measuring the Droplet Discharge Amount and Adjusting a Droplet Discharge Apparatus FIGS. 1A to 1E illustrate a droplet discharge amount measuring method according to an aspect of the invention. As shown in FIG. 1C, an ink jet droplet discharge apparatus 2 discharges, through the nozzle openings 21 thereof, droplets M of a functional solution containing a solid component and a solvent. The formation of an organic functional layer for an organic EL apparatus, which is described later, requires that the droplets M have the same amount. Thus, in this embodiment, the amounts of the droplets M are measured, and the measurements are used to adjust the driving voltage and other parameters of driving pulses for the individual pressure-generating devices (e.g., piezoelectric devices) corresponding to the individual nozzle openings 21.

The method for adjustment is as follows. First, as shown in FIG. 1A, a test plate 10 made of acrylic resin or some other material is prepared, and then a surface 15 of the test plate 10 is treated so as to have repellency against the functional solution used. In this embodiment, the surface 15 is irradiated with plasma P with a fluorine-containing gas (e.g., $CF_4$, $SF_5$, or $CHF_3$) as the carrier gas as shown in FIG. 1B, yielding a test surface 11 that is highly repellent against the functional solution.

The next process, illustrated in FIG. 1C, is discharging. In this process, an ink jet droplet discharge apparatus 2 ejects, through the nozzle openings 21 thereof, droplets M of a functional solution containing a solid component and a solvent, initially onto some area other than the test surface 11 (trial discharge) and then onto the test surface 11.

Figure 1D:
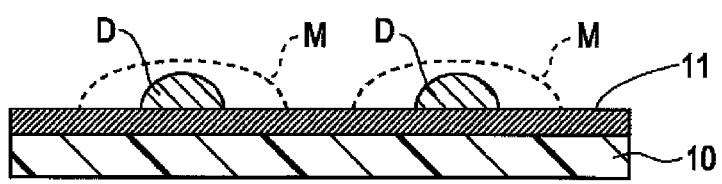

The next process, illustrated in FIG. 1D, is drying. In this process, solvent is allowed to evaporate from the droplets M that land on the test surface 11, thereby leaving solid dots D. Since the test surface 11 is highly repellent against the functional solution, the droplets M are condensed as the solvent thereof evaporates; as a result, the resulting solid dots D have smaller areas than the parent droplets M upon landing on the test surface 11. More specifically, the high repellence of the test surface 11 against the functional solution allows the droplets M to be at a great contact angle to the test surface 11 even at the initial stage of solvent evaporation, and then increases in the viscosity of the droplets M due to solvent evaporation further prevent the droplets M from wetting the test surface 11; thus, the droplets M have decreasing areas as the solvent thereof evaporates, and the solid dots D, which are left after the complete condensation of the droplets M, have the minimum area.

It is preferable in this drying process that the solvent evaporates little by little; this ensures that the solid dots D have the same final volume. The method for drying may be air drying or forced drying. For consistent condensation of the droplets M, however, drying under predetermined conditions is preferable.

Figure 1E:
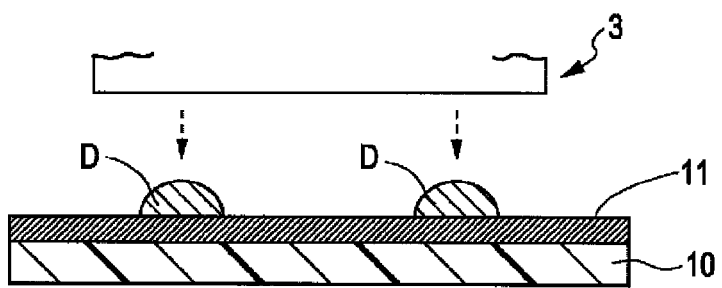

The next process, illustrated in FIG. 1E, is solid dot volume measuring, in which the volume of the individual solid dots D is measured using an imaging technique. Since the functional solution contains a solid component and a solvent at a predetermined content ratio, or since the concentration of the solid component is known, the amounts of the droplets M discharged from the individual nozzle openings 21 can be determined from the measured volume of the individual solid dots D. Thus, the amount of a droplet M is determined for each of the nozzle openings 21, and the results obtained are compared with correction data stored in a look-up table or the like and then used to adjust the driving voltage and other parameters of driving pulses for the individual pressure-generating devices (e.g., piezoelectric devices) corresponding to the individual nozzle openings 21. Then, the above-described droplet discharge amount measuring process is performed once again for the verification of the amount of droplets actually discharged from the individual nozzle openings 21. Note that although a piezoelectric jet droplet discharge apparatus, which discharges a liquid composition by utilizing changes in the volume of piezoelectric oscillators, is used in this embodiment as the ink jet droplet discharge apparatus 2, a droplet discharge apparatus that contains electrothermal converters as pressure-generating devices may be used instead.

Figure 2:
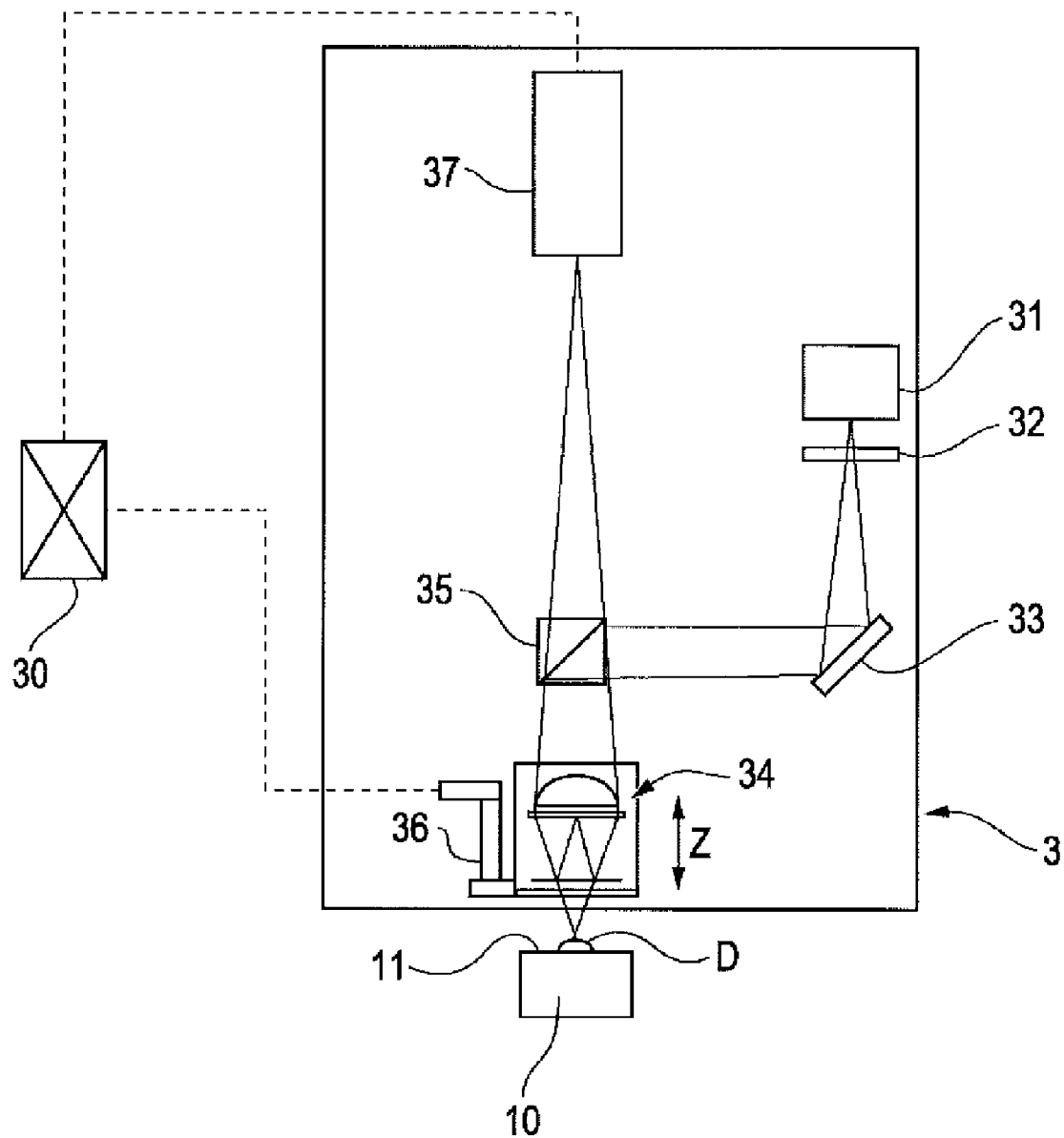
FIG. 2 shows an optical interferometer used in a droplet discharge amount measuring method according to an aspect of the invention.

In this solid dot volume measuring process, the volume of the individual solid dots D is measured using an imaging technique based on the use of the optical interferometer shown in FIG. 2.

Configuration of Optical Interferometer 3

FIG. 2 shows an optical interferometer (for volumetry) used in a droplet discharge amount measuring method according to an aspect of the invention. The optical interferometer 3 shown in FIG. 2 uses rays of white light to visualize the surface of the test substance as interference fringes. The optical interferometer 3 has a white LED 31, an interference filter (a band-pass filter) 32, a mirror 33, an interference objective lens 34, a beam splitter 35, a piezoelectric Z-axis table 36, and a (CCD) camera 37. The white LED 31 is a light source and emits rays of white light. The interference filter 32 filters the rays of white light emitted from the white LED 31. The mirror 33 reflects by 90° the rays of white light filtered through the interference filter 32. The rays of white light then enter the interference objective lens 34 by being reflected by 90° on the beam splitter 35; the interference objective lens 34 can oscillate along the Z-axis when driven by the piezoelectric Z-axis table 36. After passing through the interference objective lens 34, the rays of white light are partly reflected on solid dots D, and the rays reflected pass through the interference objective lens 34 once again and then through the beam splitter 35 and finally reach the camera 37. The rays of white light received by the camera 37 are transmitted as signals to a control unit 30 and visualized there. The images obtained are used to determine the volume of the individual solid dots D and, accordingly, to quantify the droplets discharged from the individual nozzle openings 21. As described above, since the functional solution contains a solid component and a solvent at a predetermined content ratio, or since the concentration of the solid component is known, the amounts of the droplets M discharged from the individual nozzle openings 21 can be determined from the measured volume of the individual solid dots D.

Major Advantages of this Embodiment

In the measurement of the amount of droplets M of a functional solution discharged from the droplet discharge apparatus 2 according to this embodiment, as described above, the measurement target is not the volume of the droplets M upon landing on the test surface 11, but that of solid dots D left after solvent evaporates from the droplets M, and the measured volume of solid dots D is used to quantify the droplets M; this will minimize measurement errors due to changes in droplet volume associated with solvent evaporation. The droplets M are condensed as the solvent evaporates therefrom, and thus the resulting solid dots D have smaller areas than the parent droplets M upon landing on the test surface 11. As a result, the solid dots D have a sufficient thickness for imaging-based accurate measurement of solid dot volume, and the amounts of the droplets M can be measured accurately.

In particular, this embodiment features the use of the optical interferometer 3 for visualizing the solid dots D for volumetry. This allows for not only accurate but also non-contact measurement of solid dot volume.

Additionally, this embodiment involves a plasma treatment, in which a surface 15 of the test plate 10 made of acrylic resin or some other material is treated with a fluorine-containing gas; as a result, the test surface 11, which is highly repellent against the functional solution, is formed. This facilitates the condensation of the droplets M, making sure that the resulting solid dots D have smaller areas than the parent droplets M upon landing on the test surface. As a result, the solid dots D have a further increased thickness, and thus the amounts of the droplets M can be measured more accurately.

Application to Manufacturing of Organic EL Apparatuses

The following describes a method for manufacturing an organic EL device by discharging a functional solution from the droplet discharge apparatus 2 with the droplet discharge amount adjusted. The adjustment of the droplet discharge amount is carried out using the droplet discharge amount measuring method described above with reference to FIGS. 1A to 1E and 2.

Configuration of an Organic EL Apparatus Manufactured

Figure 3A:
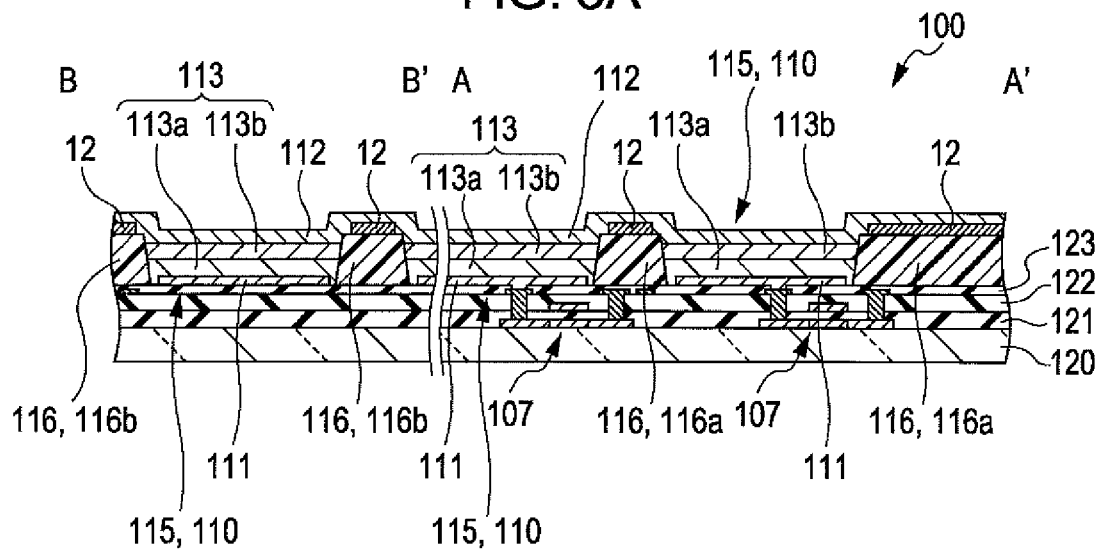
FIGS. 3A and 3B illustrate a pixel disposition for an organic EL apparatus according to an aspect of the invention.
Figure 3B:
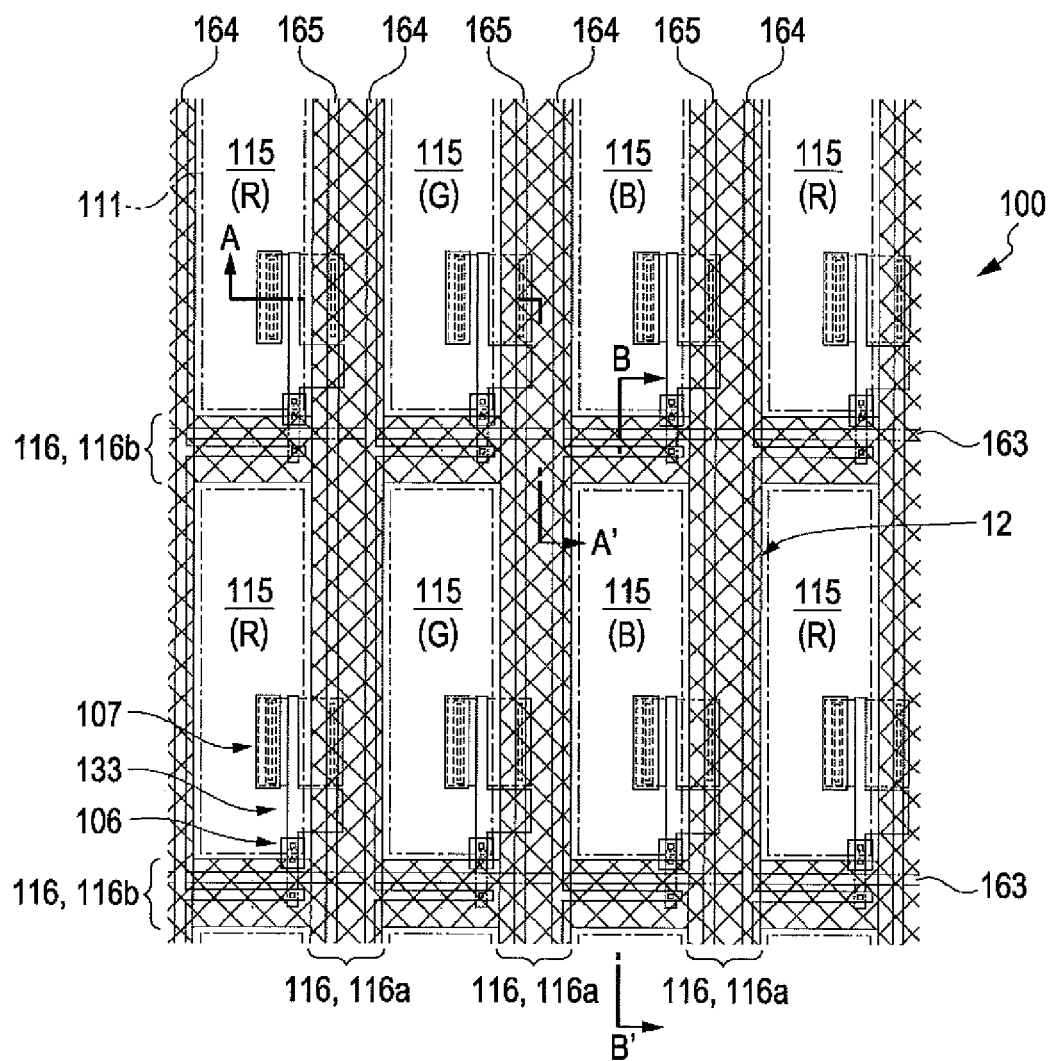
Figure 5:
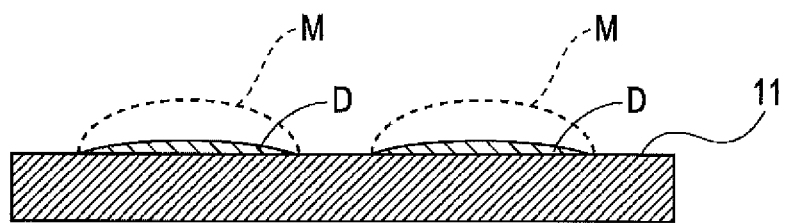
FIG. 5 illustrates a droplet discharge amount measuring method, which is later described in association with conventional and reference examples.

FIGS. 3A and 3B illustrate a pixel disposition for an organic EL apparatus according to an aspect of the invention. FIG. 3A is a plan view showing pixels disposed in the organic EL apparatus, whereas FIG. 3B is a cross-sectional view showing the same. The right side of FIG. 3A shows a cross section taken along line A-A', whereas the left side shows a cross section taken along line B-B'. Note that in FIG. 3B, partitions, which are described later, are indicated by cross-hatching.

The organic EL apparatus 100 shown in FIGS. 3A and 3B is a color display apparatus. In this embodiment, red (R), green (G), and blue (B) pixels 115 are arranged like stripes and aligned by color. This organic EL apparatus 100 has a substrate 120 (an organic EL substrate) and insulating films 121, 122, and 123 layered on the substrate 120. The substrate 120 retains electronic devices thereon and is made of glass or some other material. The insulating films 121, 122, and 123 are individually made of silicon oxide, silicon nitride, a photosensitive resin, or some other material. Additionally, thin-film transistors 106 and 107, capacitors 133, scanning lines 163, data lines 164, and common feeders 165 are formed between the insulating films 121, 122, and 123 or in other positions.

The insulating film 123 retains optically transparent pixel electrodes 111 made of ITO (indium tin oxide) or some other material. These pixel electrodes 111 are electrically connected via the contact holes formed on the insulating film 123 to the thin-film transistors 107 and then to the common feeders 165 and thus electrified with driving current.

Each of the pixels 115 contains an organic EL device 110, in which the pixel electrode 111 serving as a positive electrode layer, an organic functional layer 113, and a common electrode layer 112 serving as a negative electrode layer are layered in this order. The organic functional layer 113 has a hole injection layer 113a formed on the pixel electrode 111 and a luminescent layer 113b formed on this hole injection layer 113a. In the luminescent layer 113b, holes injected from the hole injection layer 113a and electrons injected from the common electrode layer 112 are coupled, and light is emitted. The individual pixels 115 have a color of red (R), green (G), or blue (B), depending on the organic material contained in the luminescent layer 113b thereof. In this embodiment, the hole injection layer 113a has an additional role of transporting holes to the corresponding luminescent layer 113b. Note that the individual pixels 115 have the same configuration, except for the composition of the luminescent layer 113b contained in the organic EL device and some other features, regardless of the color thereof.

The organic EL apparatus 100 according to this embodiment has a top emission structure, which emits light in the direction from the substrate 120 to the top. To this end, the common electrode layer 112 is an optically transparent electrode layer composed of, for example, a thin calcium layer, an ITO layer, and optionally some other layers. When the organic EL apparatus 100 is manufactured with this top emission structure, layers disposed under the pixel electrodes 111 are light-reflecting layers (not shown in the drawings) made of aluminum or some other material and almost or totally overlap with the pixel electrodes 111. The organic EL apparatus 100 may have a bottom emission structure, which emits light in the direction from the top to the substrate 120. Note that although not shown in the drawings, the surface of the substrate 120 on which electronic devices are retained may be covered with sealing resin that blocks water and oxygen in order to protect the negative electrode layer and the functional layers from oxidation and optionally with a sealing substrate.

In this embodiment, the individual pixels 115 are separated by partitions 116 made of a photosensitive resin and surrounding the individual pixel electrodes 111. The partitions 116 include first partitions 116a extending parallel to the data lines 164 and second partitions 116b extending parallel to the scanning lines 163. The first partitions 116a and second partitions 116b are all made of the same material, a photosensitive acrylic resin.

The partitions 116 are much taller than the pixel electrodes 111 so that they can define the areas to be coated with liquid compositions during the ink jet or liquid discharge-based formation of the organic functional layers 113, namely, the hole injection layers 113a and the luminescent layers 113b. In other words, the organic functional layers 113 are formed in depressions surrounded by the partitions 116. The surface of the individual partitions 116 is repellent against the liquid compositions used to form the organic functional layers 113, and thus the surface tension of the liquid compositions is controlled. As a result, the organic functional layers 113 are prevented from spilling out of the depressions and have similar thicknesses. Note that the liquid compositions used may be aqueous or oleaginous as long as they are fluid; even those containing solid matter are acceptable. The solid matter contained in the liquid composition, if any, may be dissolved by heating to a temperature higher than the melting point thereof or dispersed in the solvent as fine particles. The liquid compositions may further contain dyes, pigments, and/or some other functional materials.

As described above, the organic EL apparatus 100 according to this embodiment has a top emission structure. Thus, the common electrode layer 112 cannot be a light-shielding layer, such as a thick metal film, and thus has a high electric resistance. To solve this problem, the common electrode layer 112 retains auxiliary wiring layers 12 formed on the upper or lower surface thereof in the regions above the partitions 116. In this embodiment, the auxiliary wiring layers 12 are formed on the lower surface of the common electrode layer 112.

Manufacturing Method of an Organic EL Apparatus

FIGS. 4A to 4E are cross-sectional diagrams illustrating processes included in a manufacturing method of an organic EL apparatus 100 according to an aspect of the invention. The following describes a method for manufacturing an organic EL apparatus 100 according to the above-described embodiment. First, as shown in FIG. 4A, a substrate 120 covered with insulating films 121, 122, and 123, which are made of silicon oxide, silicon nitride, a photosensitive resin, or some other material, is subjected to known semiconductor processes for forming thin-film transistors 106 and 107, capacitors 133, scanning lines 163, data lines 164, common feeders 165, and other necessary elements between the insulating films 121, 122, and 123. The next process is pixel electrode formation, in which an ITO film is formed on the insulating film 123, and then the ITO film is patterned by photolithography to have pixel electrodes 111. Subsequently, the pixel electrodes 111 and exposed surfaces of the insulating film 123 are irradiated with plasma under the air atmosphere with an oxygen gas as the carrier gas ($O_2$-plasma treatment).

The next process is partition formation, in which the structure obtained in the previous process is coated with a photosensitive acrylic resin and then exposed to light for development of the resin, and thus partitions 116 are formed with a height of, for example, 1 to 2 μm, surrounding the areas to be coated with organic functional layers 113. In this process, the first partitions 116a and the second partitions 116b are formed simultaneously. The material of the partitions 116 is not limited to an acrylic resin; some other organic insulating material, such as a polyimide resin, or an inorganic insulating material, such as polysilazane, may be used instead. Then, the surface of the individual partitions 116 is treated so as to have repellency against the liquid compositions used to form the organic functional layers 113. An example of methods used for this purpose is a surface treatment with a fluorine-containing compound. Examples of fluorine-containing compounds allowed include $CF_4$, $SF_5$, $CHF_3$, and so forth. Examples of surface treatment methods allowed include plasma irradiation, UV irradiation, and so forth.

The next process is organic function layer formation. First, with the top of the substrate 120 facing up as shown in FIG. 4B, droplets Ma of a hole injection layer formation solution (a liquid composition) are discharged from a droplet discharge apparatus into the depressions surrounded by the partitions 116. The hole injection layer formation solution is, for example, a dispersion of 3,4-polyethylenedioxythiophene (a conductive polyolefin derivative) and polystyrene sulfonate (a dopant) in a solvent such as water. However, a solvent mixture of water and an organic solvent may be used as the dispersion medium when stable discharge of the droplets Ma from nozzle openings requires some optimization of the hole injection layer formation solution in terms of viscosity. Examples of organic solvents for this solvent mixture include alcohols, ethers, glycol monoethers, lactones, oxazolidinones, carbonates, nitriles, amides, sulfones, and so forth.

The next process is drying, in which the structure obtained in the previous process is dried under a pressure reduced to, for example, on the order of $10^{-4}$ to $10^{-6}$ Pa so that the solvent contained in the hole injection layer formation material can evaporate. As a result, hole injection layers 113a are formed with a thickness on the order of 10 to 100 nm on the pixel electrodes 111 as shown in FIG. 4C.

The next process is luminescent layer formation. With the top of the substrate 120 facing up as shown in FIG. 4D, droplets Mb of a luminescent layer formation solution (a liquid composition) are discharged from a droplet discharge apparatus into the depressions surrounded by the partitions 116. The luminescent material used is, for example, a polymer having a molecular weight equal to or higher than 1000, and specific examples thereof include polyfluorene derivatives, polyphenylene derivatives, polyvinylcarbazole, and polythiophene derivatives as well as materials obtained by doping them with a perylene dye, a coumarin dye, or a rhodamine dye such as rubrene, perylene, 9,10-diphenylanthracene, tetraphenyl butadiene, Nile red, coumarin 6, or quinacridone. π-Conjugated polymers, in which π-electrons originating in double bonds are delocalized along the polymer backbone, are suitable because of their nature as conductive polymers, an excellent luminescence. In particular, those having a fluorene backbone, or polyfluorenes, are more suitable than others. Besides those described above, such compositions as that for producing organic EL devices described in JP-A-11-40358, which is a composition containing a precursor of a conjugated organic polymer and at least one fluorochrome for changing the luminescent properties of the composition, can also be used as the luminescent layer formation material. As for organic solvents in which such a luminescent material is dissolved or dispersed, examples of suitable ones include non-polar solvents. In particular, those in which the hole injection layers 113a are insoluble are more suitable than others because the hole injection layers 113a are covered with luminescent layers 113b. Specific examples of suitable solvents include xylene, cyclohexylbenzene, dihydrobenzofuran, trimethylbenzene, tetramethylbenzene, and so forth. Note that in this process, the luminescent layers 113b are formed by applying the materials thereof for the individual colors, namely, red (R), green (G), and blue (B), by discharge onto their corresponding pixels 115.

The next process is drying, in which the structure obtained in the previous process is dried under a pressure reduced to, for example, on the order of $10^{-4}$ to $10^{-6}$ Pa so that the solvent contained in the luminescent layer formation material can evaporate. As a result, solid luminescent layers 113b are formed on the hole injection layers 113a, yielding organic functional layers 113 each containing the hole injection layer 113a and the luminescent layer 113b as shown in FIG. 4E.

Then, the auxiliary wiring layers 12 and the common electrode layer 112 are formed as shown in FIGS. 3A and 3B. Subsequent sealing gives an organic EL apparatus 100 in which the pixels 115 each have the organic EL device 110.

The entire disclosure of Japanese Patent Application No. 2009-088677, filed Apr. 1, 2009 is expressly incorporated by reference herein.

What is claimed is:

1. A droplet discharge amount measuring method for measuring the amount of a droplet of a functional solution discharged from a droplet discharge apparatus, the functional solution containing a solid component and a solvent, comprising:

discharging a droplet of the functional solution from the droplet discharge apparatus onto a test surface;

drying for allowing the solvent on the test surface to evaporate from the droplet so that a solid dot be left; and measuring the volume of the solid dot using an imaging technique, wherein:

in drying, the droplet is condensed as the solvent evaporates therefrom, and thus the resulting solid dot has a smaller area than the droplet upon landing on the test surface; and a repellant treatment for changing the repellency of the test surface against the functional solution is performed between discharging and drying.

2. The droplet discharge amount measuring method according to claim 1, wherein:

an optical interferometer is used to measure the volume of the solid dot.

3. An organic electroluminescence apparatus manufacturing method comprising:

forming an organic functional layer of an organic electroluminescence device by utilizing a measurement obtained using the droplet discharge amount measuring method according to claim 2 to adjust a droplet discharge amount of the functional solution discharged from the droplet discharge apparatus.

4. The droplet discharge amount measuring method according to claim 1, wherein:

the repellant treatment is a treatment of the test surface with fluorine and plasma.

5. The droplet discharge amount measuring method according to claim 4, wherein:

the test surface is made of a resin.

6. An organic electroluminescence apparatus manufacturing method comprising:

forming an organic functional layer of an organic electroluminescence device by utilizing a measurement obtained using the droplet discharge amount measuring method according to claim 5 to adjust a droplet discharge amount of the functional solution discharged from the droplet discharge apparatus.

7. An organic electroluminescence apparatus manufacturing method comprising:

forming an organic functional layer of an organic electroluminescence device by utilizing a measurement obtained using the droplet discharge amount measuring method according to claim 4 to adjust a droplet discharge amount of the functional solution discharged from the droplet discharge apparatus.

8. An organic electroluminescence apparatus manufacturing method comprising:

forming an organic functional layer of an organic electroluminescence device by utilizing a measurement obtained using the droplet discharge amount measuring method according to claim 1 to adjust a droplet discharge amount of the functional solution discharged from the droplet discharge apparatus.

* * * * *